United States Patent
Seo et al.

(10) Patent No.: US 8,395,105 B2
(45) Date of Patent: Mar. 12, 2013

(54) METHOD OF RECOGNIZING PROXIMITY USING PROXIMITY SENSOR AND MOBILE TERMINAL USING THE SAME

(75) Inventors: Won Woo Seo, Gumi-si (KR); Min Ho Song, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 374 days.

(21) Appl. No.: 12/872,205

(22) Filed: Aug. 31, 2010

(65) Prior Publication Data

US 2011/0059776 A1     Mar. 10, 2011

(30) Foreign Application Priority Data

Sep. 4, 2009    (KR) .................. 10-2009-0083542

(51) Int. Cl.
*G06M 7/00*     (2006.01)
(52) U.S. Cl. .................................... 250/221; 345/175
(58) Field of Classification Search .............. 250/221, 250/222.1, 216, 214 R, 214 C; 345/173, 345/175, 178; 356/614, 622
See application file for complete search history.

(56) References Cited

U.S. PATENT DOCUMENTS

2004/0217267 A1\* 11/2004 Reime .......................... 250/221
2010/0271321 A1\* 10/2010 Senda et al. .................. 345/173

\* cited by examiner

*Primary Examiner* — Kevin Pyo
(74) *Attorney, Agent, or Firm* — Jefferson IP Law, LLP

(57) ABSTRACT

A method of recognizing proximity using a proximity sensor and a mobile terminal using the same are provided. The method includes detecting a key input by a user, projecting light in a state where an object does not approach a proximity sensor and measuring a light receiving amount of the projected light, extracting a compensation amount corresponding to the measured light receiving amount, setting a critical light receiving amount for determining proximity recognition by compensating the measured light receiving amount with the extracted compensation amount, and recognizing proximity of an object to the proximity sensor based on a preset critical light receiving amount. Thereby, even if the surrounding environment of a mobile terminal is changed, noise characteristic of the proximity sensor is influenced, and the mobile terminal is used for a long time, a proximity recognition distance of the mobile terminal is uniformly sustained.

15 Claims, 6 Drawing Sheets

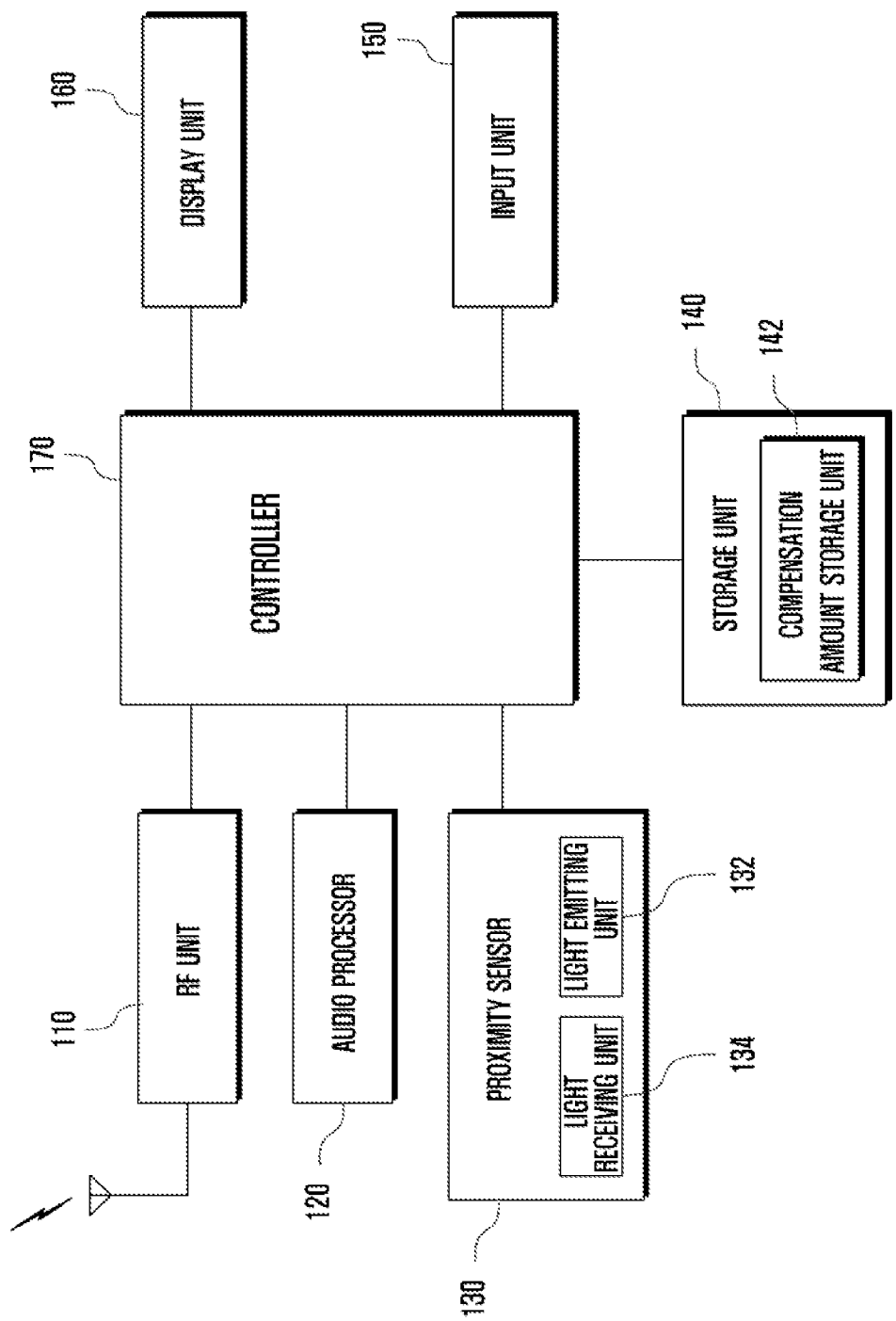

FIG. 5

| LIGHT EMITTING AMOUNT OF OPEN STATE (COUNT) | COMPENSATION AMOUNT (COUNT) |
|---|---|
| ~ 1000 | 350 |
| 1000 ~ 1250 | 400 |
| 1250 ~ 1500 | 500 |
| 1500 ~ 3000 | 700 |
| 3000 ~ 5000 | 800 |
| 5000 ~ 10000 | 950 |
| 10000 ~ 15000 | 1000 |
| 15000 ~ | 1100 |

METHOD OF RECOGNIZING PROXIMITY USING PROXIMITY SENSOR AND MOBILE TERMINAL USING THE SAME

PRIORITY

This application claims the benefit under 35 U.S.C. §119(a) of a Korean patent application filed on Sep. 4, 2009 in the Korean Intellectual Property Office and assigned Serial No. 10-2009-0083542, the entire disclosure of which is hereby incorporated by reference.

BACKGROUND OF THE INVENTION

1. Field of the Invention

The present invention relates to a method of recognizing proximity of an object in mobile terminal. More particularly, the present invention relates to an apparatus and method for recognizing proximity of an object using a proximity sensor in a mobile terminal.

2. Description of the Related Art

Nowadays, a mobile terminal is very widely used. The widespread use of the mobile terminal is based on its ability to provide various data transmission services and additional services as well as intrinsic voice communication and multimedia communication appliance services. Based on the various services that can be provided by the mobile terminal, User Interface (UI) technology that controls the mobile terminal has also been continuously developed.

Currently, a mobile terminal having a proximity sensor is available, and the mobile terminal performs a predefined function by recognizing whether a user approaches the mobile terminal. A conventional function of the mobile terminal using proximity recognition is a screen locking and release function. When a user performs communication using a mobile terminal, the mobile terminal generally contacts an ear or a cheek of the user. In a touch screen based-mobile terminal, an unintended key may be input due to a contact with the user's ear or cheek. Accordingly, the proximity sensor recognizes the proximity of the user (when an earpiece portion is hidden) such that, when the user approaches the mobile terminal, a screen locking function is executed, and when the user recedes from the mobile terminal, a screen locking function is released and thus an input of an unintended key is prevented. The proximity sensor generally uses a photodiode-based proximity sensor.

FIG. 1 is a diagram illustrating a photodiode-based proximity sensor according to the related art.

The proximity sensor 100 includes a light emitting unit 103 and a light receiving unit 105. The light emitting unit 103 may be configured with a Light Emitting Diode (LED), and the light receiving unit 105 may be configured with a photodiode. When the light emitting unit 103 projects light, the projected light is reflected by an object approaching the proximity sensor, and the reflected light is transferred to the light receiving unit 105. The light receiving unit 105 recognizes that an object approaches the proximity sensor by absorbing the transferred light. The light receiving unit 105 generates data of an amount (light receiving amount) corresponding to the amount of absorbed light, and the generated data are used for determining the degree to which an object approaches the proximity sensor.

The mobile terminal having an available proximity sensor has a reference value of a light receiving amount necessary for proximity recognition of an object. The reference value is set based on a predefined distance between the proximity sensor and the object. That is, the proximity sensor should absorb an amount of light equal to the light receiving amount reference value at the predefined distance.

However, the proximity sensor can absorb a light receiving amount of a value different from the reference value in a situation where an object is disposed at the predefined distance according to the surrounding environment (such as temperature, humidity, pressing, and an impact), a noise characteristic of the proximity sensor (noise characteristic of the light receiving unit or the light emitting unit), and extended use for a long time. That is, even if the object approaches the proximity sensor at the same distance, the mobile terminal may or may not recognize proximity of the object.

Further, conventionally, when manufacturing a mobile terminal, a failure of the proximity sensor is determined by measuring whether the proximity sensor absorbs light of a predefined amount at a predefined distance, and a proximity sensor that does not satisfy the reference is processed as a failure. A yield rate of the proximity sensor is deteriorated by the proximity sensor processed as a failure.

SUMMARY OF THE INVENTION

An aspect of the present invention is to address the above-mentioned problems and/or disadvantages and to provide at least the advantages described below. Accordingly, an aspect of the present invention is to provide a method of recognizing proximity of an object while uniformly sustaining a proximity recognition distance of a mobile terminal.

Another aspect of the present invention is to further provide a mobile terminal using the method.

In accordance with an aspect of the present invention, a method of recognizing proximity using a proximity sensor of a mobile terminal is provided. The method includes detecting a key input by a user, projecting light in a state where an object does not approach the proximity sensor and measuring a light receiving amount of the projected light, extracting a compensation amount corresponding to the measured light receiving amount, setting a critical light receiving amount for determining proximity recognition by compensating the measured light receiving amount with the extracted compensation amount, and recognizing proximity of an object to the proximity sensor based on a preset critical light receiving amount.

In accordance with another aspect of the present invention, a mobile terminal for recognizing proximity is provided. The terminal includes a proximity sensor for projecting light and recognizing proximity of an object by measuring a light receiving amount of the projected light, an input unit including at least one key that can be input by a user, a storage unit for storing a light receiving amount and a compensation amount corresponding thereto, and a controller for controlling, when a key input by the user through the input unit is detected, the proximity sensor to project light and to measure a light receiving amount of the projected light and to extract the compensation amount corresponding to the measured light receiving amount through the storage unit and to set a critical light receiving amount for determining proximity recognition by compensating the measured light receiving amount with the extracted compensation amount and to recognize proximity of an object to the proximity sensor according to the preset critical light receiving amount.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description in conjunction with the accompanying drawings, in which:

FIG. 2A is a diagram illustrating a configuration of a mobile terminal according to an exemplary embodiment of the present invention;

FIG. 5 is a diagram illustrating an example stored in a compensation amount storage unit according to an exemplary embodiment of the present invention.

Throughout the drawings, it should be noted that like reference numbers are used to depict the same or similar elements, features, and structures.

DETAILED DESCRIPTION OF EXEMPLARY EMBODIMENTS

Figure 1:
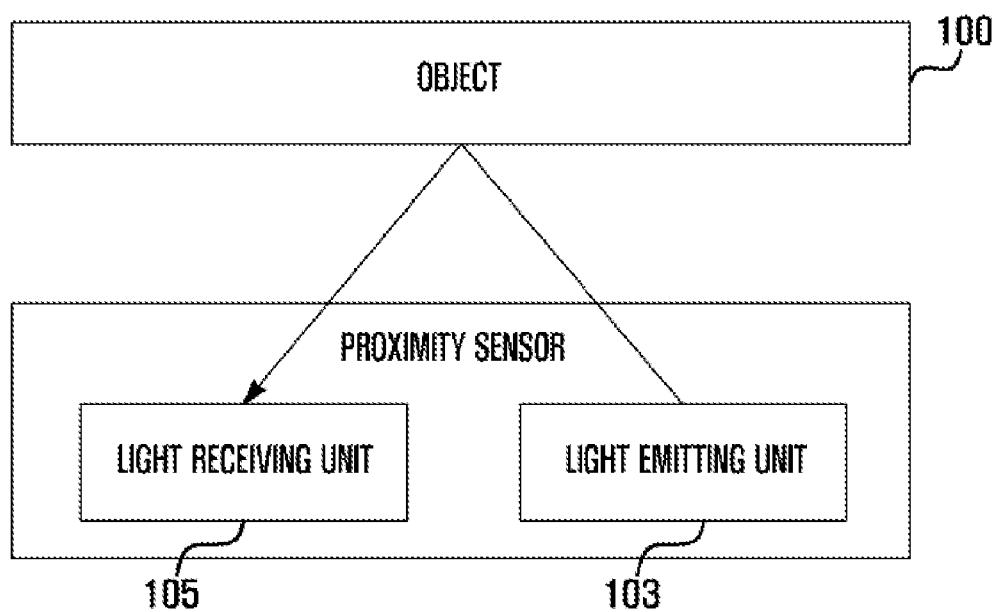
FIG. 1 is a diagram illustrating a photodiode-based proximity sensor according to the related art.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and structures are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

FIG. 2A is a diagram illustrating a configuration of a mobile terminal according to an exemplary embodiment of the present invention.

Referring to FIG. 2A, the mobile terminal includes a Radio Frequency (RF) unit 110, an audio processor 120, a proximity sensor 130, a storage unit 140, an input unit 150, a display unit 160, and a controller 170. The RF unit 110 performs a transmitting and receiving function of data for wireless communication of the mobile terminal The RF unit 110 includes an RF transmitter for up-converting a frequency of a signal to be transmitted and for amplifying the signal, and an RF receiver for low-noise amplifying a received signal and for down-converting a frequency of the signal. Further, the RF unit 110 receives data through a wireless channel, outputs the data to the controller 170 and transmits the data output from the controller 170 through the wireless channel.

The audio processor 120 is configured with a codec, and the codec includes a data codec (not shown) for processing packet data and an audio codec (not shown) for processing an audio signal such as sound. The audio processor 120 converts a digital audio signal to an analog audio signal through the audio codec and reproduces the analog audio signal through a speaker, and converts the analog audio signal input from a microphone to the digital audio signal through the audio codec.

The proximity sensor 130 performs a function of detecting proximity of an object to the mobile terminal. In an exemplary implementation, the proximity sensor 130 may be a photodiode-based proximity sensor. The proximity sensor 130 includes a light emitting unit 132 and a light receiving unit 134. The light emitting unit 132 may be configured with a Light Emitting Diode (LED), and the light receiving unit 134 may be configured with a photodiode. More particularly, the light emitting unit 132 may be configured with an Infra-Red Light Emitting Diode (IR LED) and the light receiving unit 134 may be configured with a photodiode that absorbs infrared. The proximity sensor 130 may be configured around an area contacting a user's ear when the user performs communication.

Figure 2B:
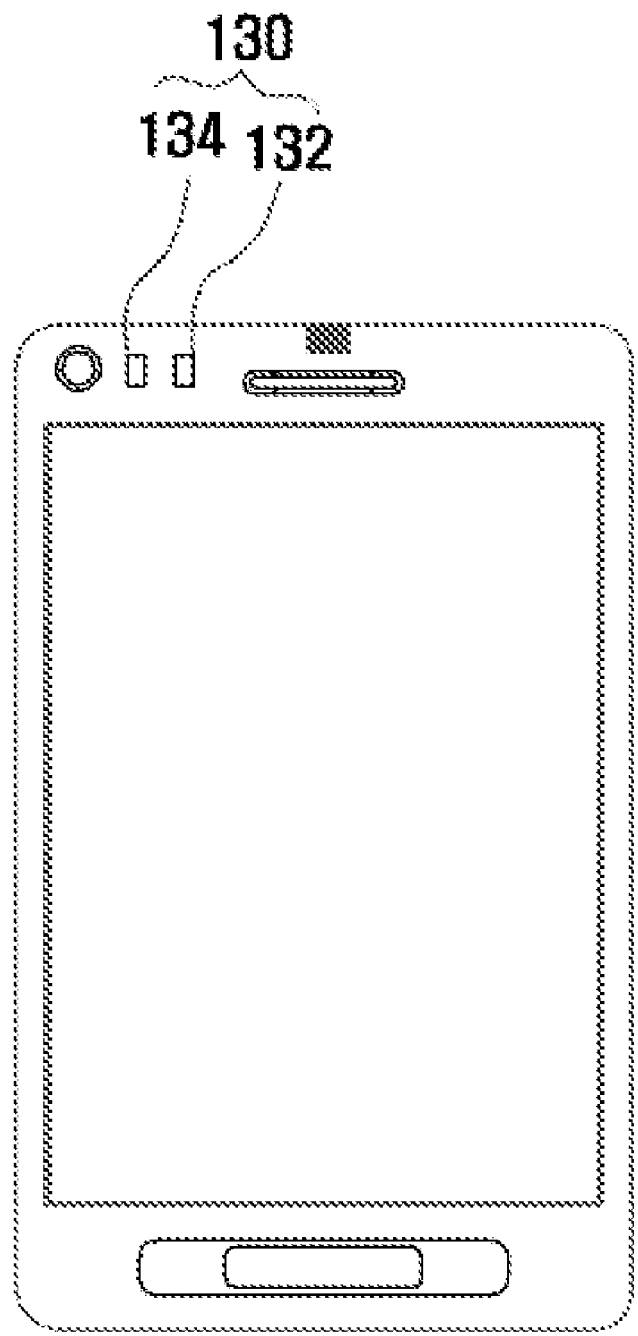
FIG. 2B illustrates a mobile terminal including a proximity sensor according to an exemplary embodiment of the present invention.

FIG. 2B illustrates a mobile terminal including a proximity sensor according to an exemplary embodiment of the present invention.

Referring to FIG. 2B, the proximity sensor 130, which is placed adjacent to an earpiece portion (speaker), includes the light emitting unit 132 and the light receiving unit 134. The light emitting unit 132 projects light (infrared rays of an IR LED), the projected light is reflected by an object approaching the proximity sensor 130, and when the reflected light is transferred to the light receiving unit 134, the light receiving unit 134 absorbs the transferred light. The light receiving unit 134 converts the absorbed light to a current and converts the converted current to an Analog-to-Digital Converter (ADC) value through an ADC. In an exemplary implementation, the ADC value may be configured with a count value of 65536 of 16 bits. The unit of the ADC value may be a 'count', 'level', or 'code'. When absorbing light, the light receiving unit 134 absorbs both light entered by reflecting among the light projected from the light emitting unit 132 and light generated by the surrounding environment such as sun light and lighting, and a light receiving amount finally measured by the light receiving unit 134 is a light receiving amount of only light entered by reflecting among light projected from the light emitting unit 132. The light receiving unit 134 outputs the measured light receiving amount to the controller 170. The measured light receiving amount is used when the controller 170 determines proximity of an object to the proximity sensor 130.

The storage unit 140 stores a program and data necessary for operating the mobile terminal and includes a program area and a data area. The storage unit 140 may be configured using a volatile storage medium or a nonvolatile storage medium and may be configured with a combination of both storage media. The volatile storage medium may include a semiconductor memory such as a Random Access Memory (RAM), Dynamic Random Access Memory (DRAM), Static Random Access Memory (SRAM), and the non-volatile storage medium includes a hard disk. In an exemplary implementation, the storage unit 140 includes a compensation amount storage unit 142. The compensation amount storage unit 142 stores a range of a light receiving amount measured in a state (open state) where an object does not approach the proximity sensor 130 and a compensation amount corresponding thereto. In order to uniformly sustain a proximity recognition distance of the mobile terminal, it is necessary to adjust a critical light receiving amount (proximity recognition critical light receiving amount) necessary for proximity recognition according to a situation. In an exemplary implementation, a light receiving amount is measured in an open state, and a proximity recognition critical light receiving amount is reset based on the light receiving amount, and a 'compensation amount' is a compensation value of a light receiving amount necessary for calculating a proximity recognition critical light receiving amount from a light receiving amount measured in an open state. The unit of the compensation amount is identical to the unit of a light receiving amount and can use a 'count', 'level', and 'code', which are the unit of the ADC value. In an exemplary implementation, whenever a user inputs a key for sending a communication call or a key for a response to communication call reception, a proximity recognition critical light receiving amount is reset, and the storage unit 140 stores the reset proximity recognition critical light receiving amount.

The input unit 150 is used for inputting a user's key manipulation signal for controlling the mobile terminal and outputs the key manipulation signal to the controller 170. The input unit 150 is configured with a keypad including a numeral key such as a 3*4 keyboard, a character key such as a QWERTY keyboard, and a navigation key, and is configured with a touch pad. In the touch screen-based mobile terminal, the input unit 150 may be integrally configured with the display unit 160. The input unit 150 generates an input signal for executing functions of the mobile terminal according to a user input and outputs the input signal to the controller 170.

The display unit 160 can be configured with a Liquid Crystal Display (LCD) and visually provides a menu, input data, function setting information, and other various information of the mobile terminal to the user. For example, the display unit 160 performs a function of outputting a booting screen, a standby screen, a display screen, a communication screen, and another application execution screen of the mobile terminal.

The controller 170 controls general operations of the mobile terminal and a signal flow of internal elements of the mobile terminal. When the controller 170 recognizes a key input (a key advancing to a dialing mode, a numeral key, a key for selecting a phonebook function after advancing to a dialing mode, or a key responding to communication call reception) through the input unit 150, the controller 170 controls the light emitting unit 132 to project light and controls the light receiving unit 134 to measure a light receiving amount of light projected by the light emitting unit 132. The light receiving unit 134 outputs the measured light receiving amount to the controller 170, and the controller 170 receives the light receiving amount, extracts a compensation amount corresponding to the received light receiving amount from the compensation amount storage unit 142, and compensates the received light receiving amount with the extracted compensation amount. The controller 170 sets the compensated light receiving amount as a proximity recognition critical light receiving amount, and stores the preset proximity recognition critical light receiving amount in the storage unit 140. After the proximity recognition critical light receiving amount is set, the controller 170 controls the light emitting unit 132 to project light, and controls the light receiving unit 134 to measure a light receiving amount of light projected by the light emitting unit 132 and to compare the measured light receiving amount and the stored proximity recognition critical light receiving amount, thereby recognizing proximity of the object to the proximity sensor 130.

Figure 3:
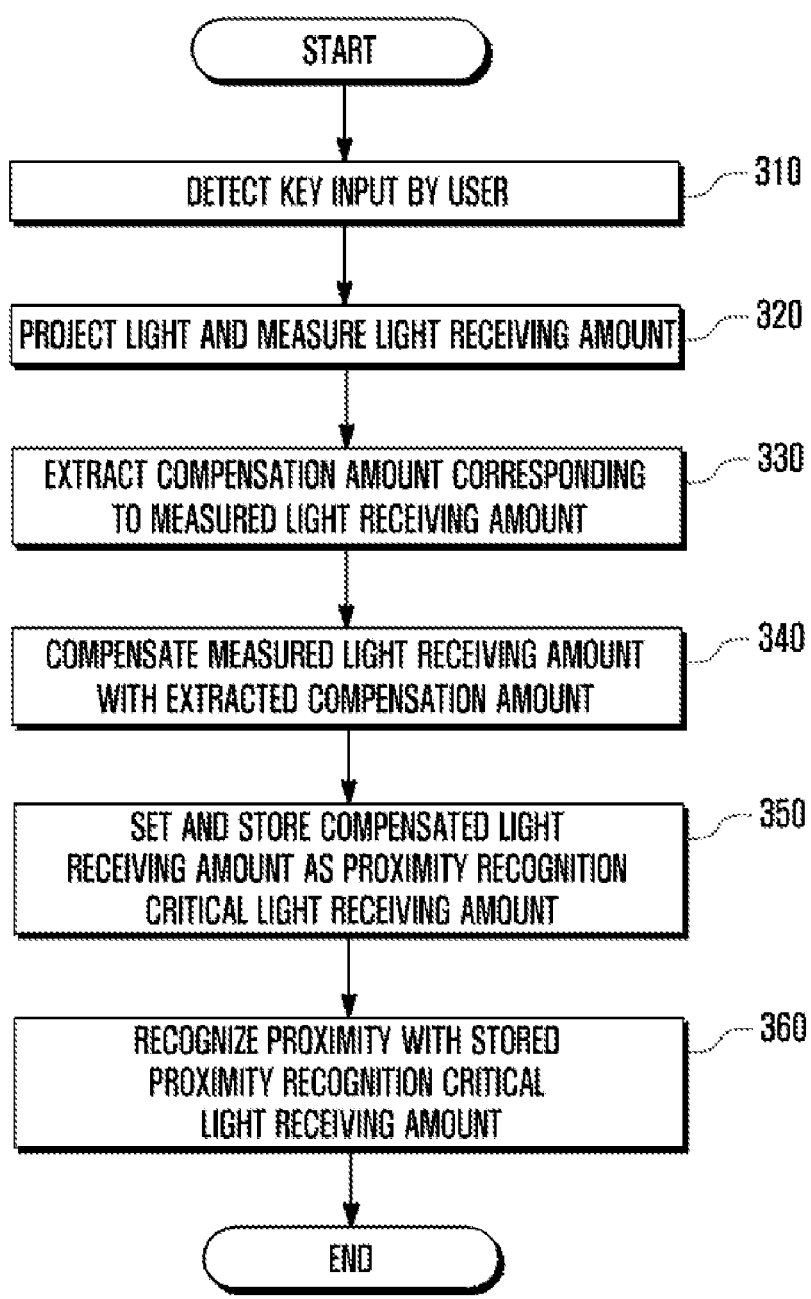
FIG. 3 is a flowchart illustrating a proximity recognition process of a mobile terminal according to an exemplary embodiment of the present invention.

FIG. 3 is a flowchart illustrating a proximity recognition process of a mobile terminal according to an exemplary embodiment of the present invention.

Referring to FIG. 3, the controller 170 detects that a predefined key is input by the user using the input unit 150 at step 310. In an exemplary implementation, the controller 170 detects that a key advancing to a dialing mode in order to send a communication call or a key selecting a phonebook function is input by the user using the input unit 150. In an exemplary implementation, the controller 170 may detect that a numeral key is input by the user using the input unit 150 in a state advanced to a dialing mode in order to send a communication call. Further, when the RF unit 110 receives a communication call, the controller 170 detects that a key, for example a communication key responding to communication call reception is input by the user using the input unit 150.

When the user inputs a key advancing to a dialing mode, a numeral key, a key selecting a phonebook function, or a key responding to communication call reception after being advanced to a dialing mode, the controller 170 controls the light emitting unit 132 to project light and controls the light receiving unit 134 to measure a light receiving amount of the projected light at step 320. In an exemplary implementation, the light emitting unit 132 may be configured with an IR LED, and the light emitting unit 132 projects infrared rays at step 320. In an exemplary implementation, when the controller 170 detects a key input by the user using the input unit 150 at step 310, it is assumed that no object approaches around the proximity sensor 130. In a state where the user intentionally hides the proximity sensor 130 or where the mobile terminal contacts the user's ear, if it is not a case where the key is pressed, when the user inputs the key, the proximity sensor 130 is in a state (open state) hidden by an object or where an object does not approach. That is, at step 320, the light receiving unit 134 measures a light receiving amount of an open state.

The controller 170 controls the light emitting unit 132 to project light for a predefined time period and controls the light receiving unit 134 to absorb light and to measure a light receiving amount. For example, the light emitting unit 132 may project light 10 times for 1 second in units of 0.1 seconds, and the light receiving unit 134 may measure a light receiving amount by absorbing light 10 times for 1 second in units of 0.1 seconds. The light receiving unit 134 converts absorbed light to a current and converts the converted current to an ADC value through an Analog-to-Digital Converter (ADC). In an exemplary implementation, the ADC value may be configured with count values of 65536 of 16 bits. The unit of the ADC value can use a 'count', 'level', and 'code'.

In an exemplary implementation, a light receiving amount finally measured by the light receiving unit 134 may be a light receiving amount of light entered by reflecting among light projected from the light emitting unit 132. When absorbing light, the light receiving unit 134 absorbs light entered by reflecting among light projected from the light emitting unit 132 and light generated from the surrounding environment such as sun light and lighting, and light necessary for proximity recognition is only light entered by reflecting among light projected from the light emitting unit 132. Therefore, the light receiving unit 134 removes light from the surrounding environment among absorbed light and finally measures a light receiving amount of only light entered by reflecting among light projected from the light emitting unit 132. For example, when the light emitting unit 132 projects light with a cycle of 0.1 seconds, if an actual projecting time period of light is 0.01 seconds, which is ¹⁄₁₀ of 0.1 seconds, the light receiving unit 134 absorbs both light entered by reflecting among light projected from the light emitting unit 132 and light generated from the surrounding environment for 0.01 seconds and absorbs only light generated from the surrounding environment for 0.09 seconds. Therefore, the light receiving unit 134 can measure a light receiving amount by dividing a case where absorbing both light entered by reflecting among light projected from the light emitting unit 132 and light generated from the surrounding environment and a case where absorbing only light generated from the surrounding environment. The light receiving unit 134 can finally measure only a light receiving amount of light entered by reflecting light among light projected from the light emitting unit 132 using the measured light receiving amount. The light receiving unit 134 outputs the measured light receiving amount to the controller 170. In an exemplary implementation, the light receiving unit 134 may calculate an average value of measured values of the remaining 5 times, except for measured values of the first 5 times among measurement of 10 times and outputs the average value to the controller 170.

The controller 170 extracts a compensation amount corresponding to the light receiving amount output from the light receiving unit 134 from the compensation amount storage unit 142 at step 330.

FIG. 5 is a diagram illustrating an example stored in a compensation amount storage unit. The compensation amount storage unit is illustrated in a table form, and a light receiving amount and a compensation amount of an open state are matched and stored.

Referring to FIG. 5, the light receiving amount of an open state corresponds to a range of a measured light receiving amount in a state where an object does not approach the proximity sensor 130, and the compensation amount is a compensation value of a light receiving amount necessary for uniformly sustaining a proximity recognition distance of the mobile terminal in a range of each light receiving amount. For example, when a light receiving amount measured by the light receiving unit 134 is 4500 (count), the controller 170 extracts 800 (count), which is the compensation amount corresponding thereto from the compensation amount storage unit 142.

Referring back to FIG. 3, the controller 170 compensates the measured light receiving amount with the extracted compensation amount at step 340. For example, when the measured light receiving amount is 4500 (count) and the extracted compensation amount is 800 (count), the controller 170 calculates a compensated light receiving amount of 5300 (count) by adding the two values.

The controller 170 sets the compensated light receiving amount as a proximity recognition critical light receiving amount, and stores the set proximity recognition critical light receiving amount in the storage unit 140 at step 350. In an exemplary implementation, a 'proximity recognition critical light receiving amount' may be a minimum light receiving amount necessary when the controller 170 recognizes proximity of an object. In an exemplary implementation, before the controller 170 may complete a proximity recognition critical light receiving amount setting process, if an input of a key terminating a dialing mode or a phonebook function through the input unit 150 is detected, the controller 170 may terminate a proximity recognition critical light receiving amount setting process.

The controller 170 recognizes proximity of an object with a stored proximity recognition critical light receiving amount at step 360. The controller 170 controls the light emitting unit 132 to project light with a predefined cycle and controls the light receiving unit 134 to measure a light receiving amount of the projected light. When the measured light receiving amount is equal to or greater than a proximity recognition critical light receiving amount stored in the storage unit 140, the controller 170 detects that an object approaches the proximity sensor 130 and executes a function corresponding thereto.

Figure 4:
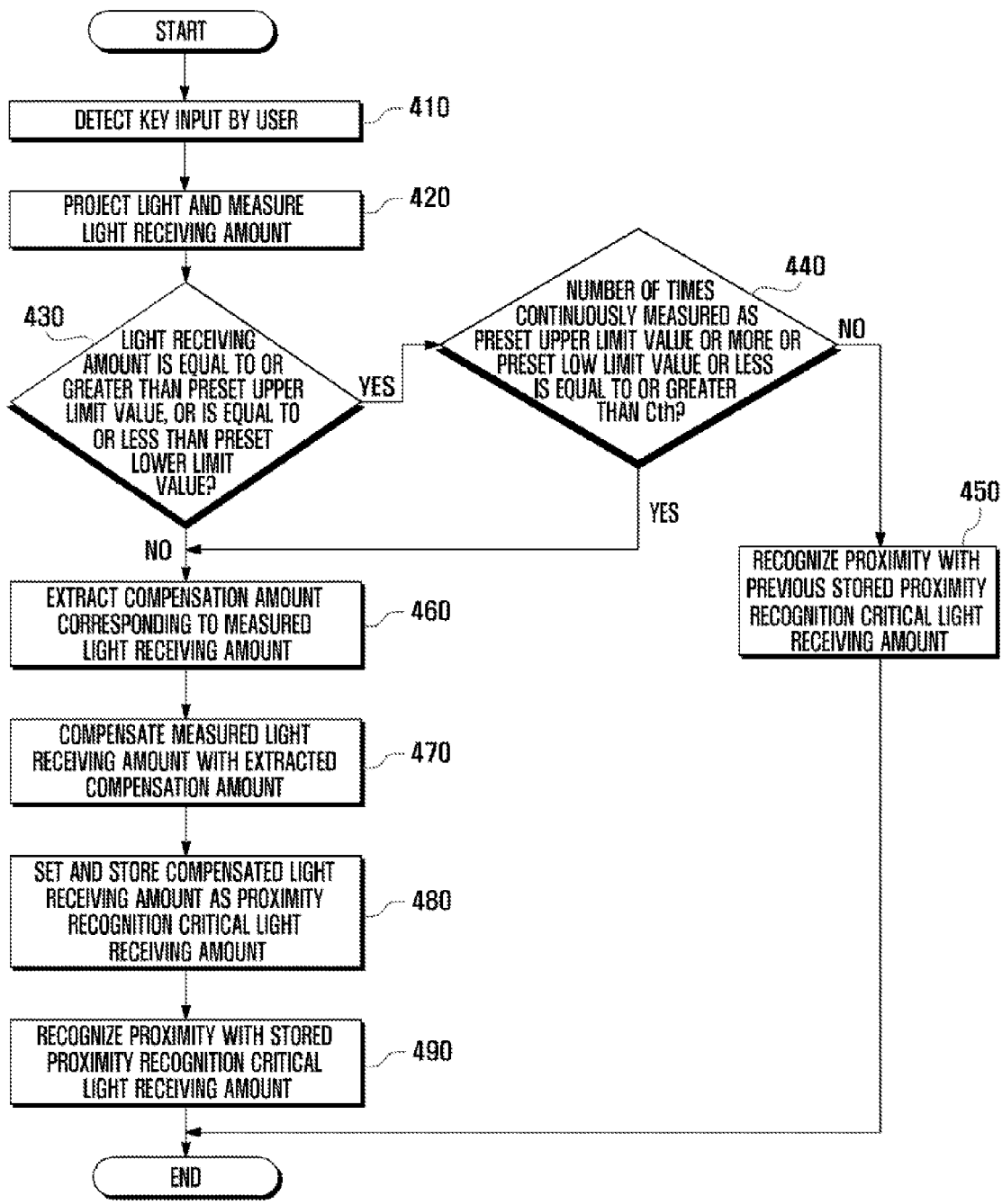
FIG. 4 is a flowchart illustrating a proximity recognition process of a mobile terminal according to an exemplary embodiment of the present invention.

FIG. 4 is a flowchart illustrating a proximity recognition process of a mobile terminal according to an exemplary embodiment of the present invention.

Referring to FIG. 4, proximity recognition processes of a mobile terminal will be illustrated, which include a process of setting an upper limit value or a low limit value of a light receiving amount measured in a state where an object does not approach the proximity sensor 130, a process of determining whether the measured light receiving amount is equal to or greater than the upper limit value, or is equal to or less than the low limit value, and a process of determining whether the number of times measured as the upper limit value or more or the low limit value or less is equal to or greater than a predetermined number of times. In an exemplary implementation, the proximity recognition critical light receiving amount may be a changeable value and a predefined numerical value may be previously stored in the storage unit 140.

Steps 410 and 420 correspond to steps 310 and 320 of FIG. 3. The controller 170 determines whether a key is input by the user in order to send a communication call or a key responding to a communication call reception is input by the user using the input unit 150, controls, if a key is input, the light emitting unit 132 to project light (IR), and controls the light receiving unit 134 to measure a light receiving amount of the projected light.

In an exemplary implementation, the controller 170 may control the light receiving unit 134 to measure a light receiving amount, and when a light receiving amount is measured, it is assumed that an object does not approach the proximity sensor 130. The light receiving unit 134 converts absorbed light to a current and converts the converted current to an ADC value through the ADC. In an exemplary implementation, the light receiving unit 134 may absorb both light entered by reflecting among light projected from the light emitting unit 132 and light generated from the surrounding environment, and the light receiving unit 134 finally measures a light receiving amount of light entered by reflecting among the light projected from the light emitting unit 132. The light receiving unit 134 divides an amount of light absorbed when the light emitting unit 132 projects light and an amount of light absorbed when the light emitting unit 132 does not project light, measures the amounts, and measures a light receiving amount of light entered by reflecting among light projected from the light emitting unit 132 using a difference value of the measured values. The light receiving unit 134 outputs the measured light receiving amount to the controller 170.

The controller 170 determines whether a light receiving amount received from the light receiving unit 134 is equal to or greater than a preset upper limit value, or is equal to or less than a preset lower limit value at step 430. In an exemplary implementation, when the controller 170 controls the light receiving unit 134 to measure a light receiving amount, it is assumed in a state (open state) where no object is positioned around the proximity sensor 130. However, when the user inputs a key, in a state where the proximity sensor 130 is hidden by the user's hand, or where the mobile phone contacts the user's ear, if a key is input, most of the light projected from the light emitting unit 132 is transferred to the light receiving unit 134 and thus a numerical value of a light receiving amount measured by the light receiving unit 134 can rapidly rise. Because this may cause an erroneous operation of the proximity sensor 130, it is preferable to not perform a proximity recognition critical light receiving amount setting process in the situation. In order to determine the situation, the storage unit 140 stores an upper limit value of a light receiving amount of an open state, and the controller 170 determines whether the measured light receiving amount is equal to or greater than an upper limit value. In an exemplary implementation, an upper limit value is set as a value of 125% of a previously stored proximity recognition critical light receiving amount. That is, the controller 170 determines whether the measured light receiving amount is a value of 125% or more of a most recently set proximity recognition critical light receiving amount and determines whether to perform a proximity recognition critical light receiving amount setting process.

Further, when the controller 170 controls the light receiving unit 134 to measure a light receiving amount at step 420, the mobile terminal is in a state (open state) where no object is positioned around the proximity sensor 130, however the light receiving unit 134 may measure a light receiving amount of a maximum value (a maximum amount of light in which the light receiving unit 134 can absorb) due to strong sun light. The maximum amount of light absorbed by the light receiving unit 134 is 65535 (count), and if an amount of light that is absorbed from sun light exceeds 65535 (count), an amount of light absorbed by the light receiving unit 134 when the light emitting unit 132 projects light is identical (65535 count) to an amount of light absorbed by the light receiving unit 134 when the light emitting unit 132 does not project light and thus a difference value (a light receiving amount finally measured by the light receiving unit 134) becomes 0 (count). Even in this case, because an erroneous operation of the proximity sensor 130 may occur, it is preferable not to perform a proximity recognition critical light receiving amount setting process in the above situation. In order to determine the situation, the storage unit 140 stores a low limit value of a light receiving amount of an open state, and the controller 170 determines whether a measured light receiving amount is equal to or less than a low limit value. In an exemplary implementation, the low limit value may be set to 35% of a previously stored proximity recognition critical light receiving amount or 300 (count). That is, the controller 170 determines whether a measured light receiving amount is 300 (count) or less, or a value of 35% or less of a most recently set proximity recognition critical light receiving amount and thus determines whether to perform a proximity recognition critical light receiving amount setting process.

If it is determined at step 430 that a light receiving amount received from the light receiving unit 134 is equal to or greater than a preset upper limit value, or is equal to or less than a preset low limit value, the controller 170 determines whether the number of times continuously measured as a preset upper limit value or more or a preset low limit value or less is equal to or greater than a preset number of times Cth at step 440. In an exemplary implementation, Cth may be set to 10.

If it is determined at step 440 that the number of times continuously measured as a preset upper limit value or more or a preset low limit value or less is less than a preset number of times Cth, the controller 170 recognizes proximity with a previous stored proximity recognition critical light receiving amount (most recently set and stored proximity recognition critical light receiving amount) at step 450.

If a light receiving amount received from the light receiving unit 134 is equal to or greater than a preset upper limit value, or is equal to or less than a preset lower limit value at step 430, as far as the number of times continuously measured as a preset upper limit value or more or a preset low limit value or less does not exceed a predefined number of times, a proximity recognition critical light receiving amount reset process of steps 460 to 490 is omitted, and the controller 170 recognizes proximity with a most recently set and stored proximity recognition critical light receiving amount.

In contrast, if it is determined at step 440 that the number of times continuously measured as a preset upper limit value or more or a preset low limit value or less is equal to or greater than a preset number of times Cth, the controller 170 resets a proximity recognition critical light receiving amount. Therefore, by performing steps 460 to 490, the controller 170 resets a proximity recognition critical light receiving amount.

In contrast, if it is determined at step 430 that a light receiving amount measured in an open state is a value between an upper limit value and a low limit value, the controller 170 performs steps 460 to 490. Steps 460 to 490 correspond to steps 330 to 360 of FIG. 3.

The proximity sensor projects light in a state (open state) that is not hidden by an object, measures a light receiving amount of the projected light, resets a critical light receiving amount for determining proximity recognition by compensating a measured light receiving amount with a compensation amount stored to correspond thereto (compensation value for uniformly sustaining a proximity recognition distance), uniformly sustains a proximity recognition distance by recognizing proximity using the reset critical light receiving amount, and prevents erroneous operation of the proximity sensor.

As described above, according to an exemplary embodiment of the present invention, even if the surrounding environment (a temperature, humidity, pressing, and an impact) of a mobile terminal is changed, a noise characteristic of the proximity sensor (noise characteristic of the light receiving unit or the light emitting unit) is influenced, or the mobile terminal is used for a long time, a proximity recognition distance of the mobile terminal is uniformly sustained. Further, when manufacturing the mobile terminal, a yield rate of the proximity sensor is improved.

While the invention has been shown with reference to certain exemplary embodiments thereof, it will be understood by those skilled in the art that various changes in form and details may be made therein without departing from the spirit and scope of the invention as defined by the appended claims and their equivalents.

What is claimed is:

1. A method of recognizing proximity using a proximity sensor of a mobile terminal, the method comprising:
    detecting a key input by a user;
    projecting light in a state where an object does not approach the proximity sensor and measuring a light receiving amount of the projected light;
    extracting a compensation amount corresponding to the measured light receiving amount;
    setting a critical light receiving amount for determining proximity recognition by compensating the measured light receiving amount with the extracted compensation amount; and
    recognizing proximity of an object to the proximity sensor based on a preset critical light receiving amount.

2. The method of claim 1, wherein the detecting of the key input by the user comprises detecting at least one of an input of a numeral key and an input of a phonebook function entry key.

3. The method of claim 1, wherein the recognizing of the proximity of the object to the proximity sensor comprises:
    projecting light and measuring a light receiving amount of the projected light; and recognizing, if the measured light receiving amount is equal to or greater than the preset critical light receiving amount, that the object approaches the proximity sensor.

4. The method of claim 1, further comprising:
determining whether the measured light receiving amount is equal to or greater than a preset upper limit value or is equal to or less than a preset lower limit value; and
recognizing, if it is determined that the measured light receiving amount is equal to or greater than a preset upper limit value or is equal to or less than a preset lower limit value, proximity of an object to the proximity sensor based on the preset critical light receiving amount.

5. The method of claim 1, further comprising:
determining whether the measured light receiving amount is equal to or greater than a preset upper limit value or is equal to or less than a preset lower limit value; and
determining, if it is determined that the measured light receiving amount is equal to or greater than a preset upper limit value or is equal to or less than a preset lower limit value, whether the number of times continuously measured as the preset upper limit value or more or the preset low limit value or less is equal to or greater than a preset number of times,
wherein the measuring of the light receiving amount of the projected light is performed when the number of times continuously measured as a preset upper limit value or more or a preset low limit value or less is equal to or greater than the preset number of times.

6. The method of claim 5, wherein the recognizing of the proximity of the object to the proximity sensor comprises:
recognizing, if it is determined that the number of times continuously measured as the preset upper limit value or more or the preset low limit value or less is less than the preset number of times, proximity of an object to the proximity sensor based on the preset critical light receiving amount.

7. A mobile terminal for recognizing proximity, the terminal comprising:
a proximity sensor for projecting light and recognizing proximity of an object by measuring a light receiving amount of the projected light;
an input unit comprising at least one key that can be input by a user;
a storage unit for storing a light receiving amount and a compensation amount corresponding thereto; and
a controller for controlling, when a key input by the user is detected through the input unit, the proximity sensor to project light and to measure a light receiving amount of the projected light and to extract a compensation amount corresponding to the measured light receiving amount through the storage unit and to set a critical light receiving amount for determining proximity recognition by compensating the measured light receiving amount with the extracted compensation amount and to recognize proximity of an object to the proximity sensor according to the preset critical light receiving amount.

8. The terminal of claim 7, wherein the controller controls, when an input of a numeral key or an input of a phonebook function entry key is detected, the proximity sensor to project light and to measure a light receiving amount of the projected light.

9. The terminal of claim 7, wherein the controller controls, after the critical light receiving amount is set, the proximity sensor to project light and to measure a light receiving amount of the projected light and to recognize, if the measured light receiving amount is equal to or greater than a preset critical light receiving amount, that an object approaches the proximity sensor.

10. The terminal of claim 7, wherein the controller determines whether the measured light receiving amount is equal to or greater than a preset upper limit value or is equal to or less than a preset low limit value and recognizes, if the measured light receiving amount is a preset upper limit value or more or a preset low limit value or less, proximity to the proximity sensor based on the preset critical light receiving amount.

11. The terminal of claim 7, wherein the controller determines whether the measured light receiving amount is equal to or greater than a preset upper limit value or is equal to or less than a preset low limit value and recognizes, if the measured light receiving amount is equal to or greater than a preset upper limit value or is equal to or less than a preset low limit value, and determines whether the number of times in which a light receiving amount is measured as the preset upper limit value or more or the preset low limit value or less is equal to or greater than the preset number of times and controls, if the number of times in which a light receiving amount is measured as the preset upper limit value or more or the preset low limit value or less is equal to or greater than the preset number of times, the proximity sensor to project light and to measure a light receiving amount of the projected light.

12. An apparatus for recognizing proximity, the apparatus comprising:
a proximity sensor for projecting light and recognizing proximity of an object by measuring a light receiving amount of the projected light;
a storage unit for storing a light receiving amount and a compensation amount corresponding thereto; and
a controller for controlling, when a key input is detected, the proximity sensor to project light and to measure a light receiving amount of the projected light and to extract a compensation amount corresponding to the measured light receiving amount through the storage unit and to set a critical light receiving amount for determining proximity recognition by compensating the measured light receiving amount with the extracted compensation amount and to recognize proximity of an object to the proximity sensor according to the preset critical light receiving amount.

13. The apparatus of claim 12, wherein the controller controls, after the critical light receiving amount is set, the proximity sensor to project light and to measure a light receiving amount of the projected light and to recognize, if the measured light receiving amount is equal to or greater than a preset critical light receiving amount, that an object approaches the proximity sensor.

14. The apparatus of claim 12, wherein the controller determines whether the measured light receiving amount is equal to or greater than a preset upper limit value or is equal to or less than a preset low limit value and recognizes, if the measured light receiving amount is a preset upper limit value or more or a preset low limit value or less, proximity to the proximity sensor based on the preset critical light receiving amount.

15. The apparatus of claim 12, wherein the controller determines whether the measured light receiving amount is equal to or greater than a preset upper limit value or is equal to or less than a preset low limit value and recognizes, if the measured light receiving amount is equal to or greater than a preset upper limit value or is equal to or less than a preset low limit value, and determines whether the number of times in which a light receiving amount is measured as the preset upper limit value or more or the preset low limit value or less is equal to or greater than the preset number of times and controls, if the number of times in which a light receiving amount is measured as the preset upper limit value or more or the preset low limit value or less is equal to or greater than the preset number of times, the proximity sensor to project light and to measure a light receiving amount of the projected light.

* * * * *